(12) United States Patent
Kim

(10) Patent No.: US 10,475,749 B2
(45) Date of Patent: Nov. 12, 2019

(54) SEMICONDUCTOR PACKAGE

(71) Applicant: Samsung Electronics Co., Ltd., Suwon-si (KR)

(72) Inventor: Sunchul Kim, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/971,253

(22) Filed: May 4, 2018

(65) Prior Publication Data
US 2019/0103364 A1 Apr. 4, 2019

(30) Foreign Application Priority Data
Sep. 29, 2017 (KR) ........................ 10-2017-0127034

(51) Int. Cl.
*H01L 23/544* (2006.01)
*H01L 25/065* (2006.01)
(Continued)

(52) U.S. Cl.
CPC ........ *H01L 23/544* (2013.01); *H01L 23/3128* (2013.01); *H01L 23/49816* (2013.01); *H01L 25/0657* (2013.01); *H01L 2223/54426* (2013.01); *H01L 2224/16225* (2013.01); *H01L 2224/48091* (2013.01); *H01L 2224/48227* (2013.01); *H01L 2224/97* (2013.01); *H01L 2225/0652* (2013.01); *H01L 2924/15311* (2013.01); *H01L 2924/1815* (2013.01); *H01L 2924/18161* (2013.01)

(58) Field of Classification Search
CPC .............. H01L 23/544; H01L 23/3128; H01L 25/0657; H01L 25/0753; H01L 25/50; H01L 2223/54426; H01L 2225/0652
See application file for complete search history.

(56) References Cited

U.S. PATENT DOCUMENTS 7,378,734 B2 5/2008 Yabuki et al.
7,777,351 B1 8/2010 Berry et al.
(Continued)

FOREIGN PATENT DOCUMENTS

JP 5622767 B2 11/2014
KR 10-2005-0006547 A 1/2005
(Continued)

OTHER PUBLICATIONS

Examination report dated Aug. 27, 2018 from the Singapore Patent Office for corresponding Singapore Patent Application.

*Primary Examiner* — Nikolay K Yushin
(74) *Attorney, Agent, or Firm* — Muir Patent Law, PLLC

(57) ABSTRACT

A semiconductor package includes a first semiconductor chip on a first substrate, a first mold layer provided on the first substrate to cover a side surface of the first semiconductor chip, a solder structure provided on the first substrate, and a second substrate provided on the solder structure. A guide receptacle is formed at one of a top surface of the first mold layer and a bottom surface of the second substrate, a first alignment protrusion is formed at the other of the top surface of the first mold layer and the bottom surface of the second substrate, and at least a portion of the first alignment protrusion is provided in the guide receptacle.

19 Claims, 19 Drawing Sheets

(51) Int. Cl.
*H01L 23/31* (2006.01)
*H01L 23/498* (2006.01)

(56) References Cited

U.S. PATENT DOCUMENTS

| | | | |
|---|---|---|---|
| 8,884,445 B2 | 11/2014 | Lee | |
| 9,252,031 B2* | 2/2016 | Im | H01L 23/3677 |
| 9,324,657 B2* | 4/2016 | Seo | H01L 25/50 |
| 9,666,571 B2 | 5/2017 | Kao et al. | |
| 9,673,184 B2 | 6/2017 | Hsu et al. | |
| 9,796,583 B2 | 10/2017 | Coppeta et al. | |
| 2009/0079052 A1* | 3/2009 | Youn | H01L 21/566 |
| | | | 257/678 |
| 2010/0072600 A1* | 3/2010 | Gerber | H01L 21/561 |
| | | | 257/686 |
| 2012/0211885 A1 | 8/2012 | Choi et al. | |
| 2012/0306075 A1 | 12/2012 | Kim et al. | |
| 2015/0084170 A1* | 3/2015 | Im | H01L 23/3677 |
| | | | 257/675 |
| 2015/0130041 A1* | 5/2015 | Seo | H01L 23/3128 |
| | | | 257/686 |
| 2015/0221625 A1 | 8/2015 | Chun et al. | |
| 2017/0040308 A1 | 2/2017 | Ko | |
| 2018/0145061 A1 | 5/2018 | Jeong et al. | |

FOREIGN PATENT DOCUMENTS

| | | |
|---|---|---|
| KR | 10-2007-0062087 A | 6/2007 |
| KR | 10-2011-0139367 A | 12/2011 |
| KR | 10-2012-0048841 A | 5/2012 |

* cited by examiner

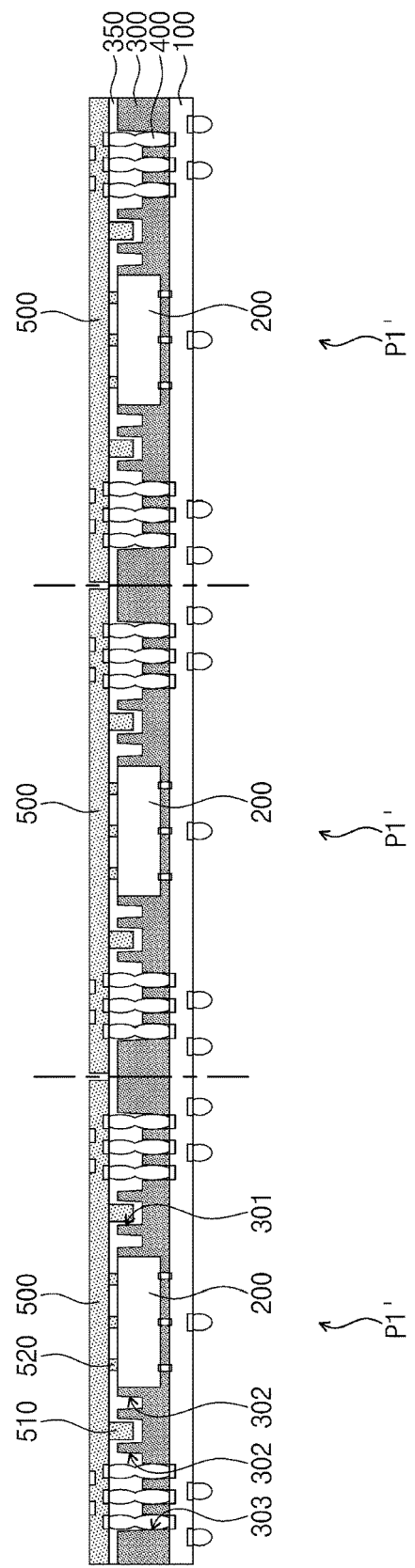

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2017-0127034, filed on Sep. 29, 2017, in the Korean Intellectual Property Office, the entire contents of which are hereby incorporated by reference.

BACKGROUND OF THE INVENTION

The present disclosure relates to a semiconductor package, and in particular, to a stacked semiconductor package.

If an integrated circuit (IC) chip is provided in the form of a semiconductor package, it can be easily used as a part of an electronic product. In general, the semiconductor package includes a package substrate such as a printed circuit board (PCB), a semiconductor chip which is mounted on the PCB and is electrically connected to the PCB by bonding wires or bumps, and a molding layer, or encapsulation layer covering the semiconductor chips and PCB. Many studies are being conducted to improve reliability of the semiconductor package, with development of the semiconductor industry.

SUMMARY

Some embodiments of the inventive concepts provide a highly reliable semiconductor package and a method of fabricating the same.

According to some embodiments of the inventive concepts, a semiconductor package includes a first semiconductor chip on a first substrate, a first mold layer provided on the first substrate to cover a side surface of the first semiconductor chip, a solder structure provided on the first substrate, and a second substrate provided on the solder structure. A guide receptacle is formed at one of a top surface of the first mold layer and a bottom surface of the second substrate, a first alignment protrusion is formed at the other of the top surface of the first mold layer and the bottom surface of the second substrate, and at least a portion of the first alignment protrusion is provided in the guide receptacle.

According to some embodiments of the inventive concepts, a semiconductor package may include a first substrate, a first semiconductor chip on the first substrate, a first mold layer provided on the first substrate to cover a side surface of the first semiconductor chip, the first mold layer including a first guide portion formed in a top surface thereof, solder structures provided on the first substrate, and an interposer substrate provided on the solder structures and spaced apart from the first semiconductor chip. The interposer substrate may include a first insulating protruding portion provided on a bottom surface thereof, and at least a portion of a side surface of the first insulating protruding portion faces a side surface of the first guide portion.

According to some embodiments of the inventive concepts, a semiconductor package may include a first semiconductor chip on a first substrate, a first mold layer covering a side surface of the first semiconductor chip, the first mold layer having a first top surface and a second top surface, which is located at a level lower than the first top surface, a solder structure provided on the first substrate, and a second substrate provided on the solder structure. The second substrate may include a protruding portion provided on a bottom surface thereof, and a bottom surface of the protruding portion may be located at a level, which is lower than the first top surface of the first mold layer and is equal to or higher than the second top surface of the first mold layer. The protruding portion may be spaced apart from the solder structure and the first semiconductor chip when viewed in a plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 7 is a sectional view illustrating a process of fabricating a first semiconductor package according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
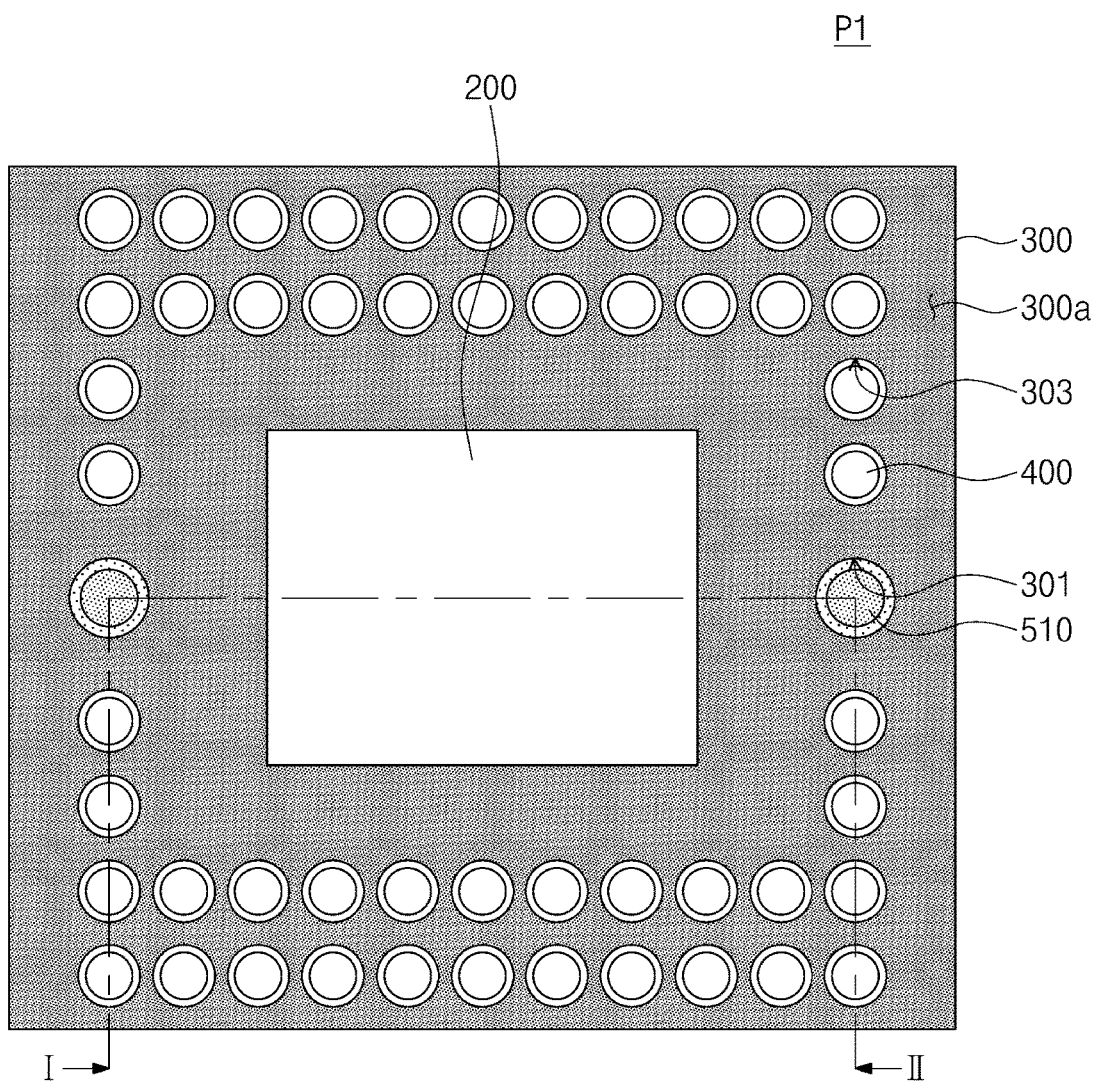
FIG. 1 is a plan view illustrating a first semiconductor package according to some embodiments of the inventive concepts.

FIG. 1 is a plan view illustrating a first semiconductor package according to some embodiments of the inventive concepts. FIGS. 2A, 2B, 2C, and 2E are sectional views illustrating a method of fabricating a first semiconductor package according to some embodiments of the inventive concepts, taken along line I-II of FIG. 1. FIG. 2D is an enlarged sectional view illustrating a portion 'III' of FIG. 2C.

As discussed herein, a "semiconductor package" refers to a semiconductor device that includes a semiconductor chip, a package substrate, and an encapsulation layer or mold layer that covers at least part of the semiconductor chip and package substrate. A semiconductor package may refer to a package-on-package device. A "semiconductor chip" refers to a die, for example singulated from a wafer, that includes an integrated circuit (IC). A semiconductor chip or semiconductor package may each be generally referred to as a semiconductor device.

Figure 2A:
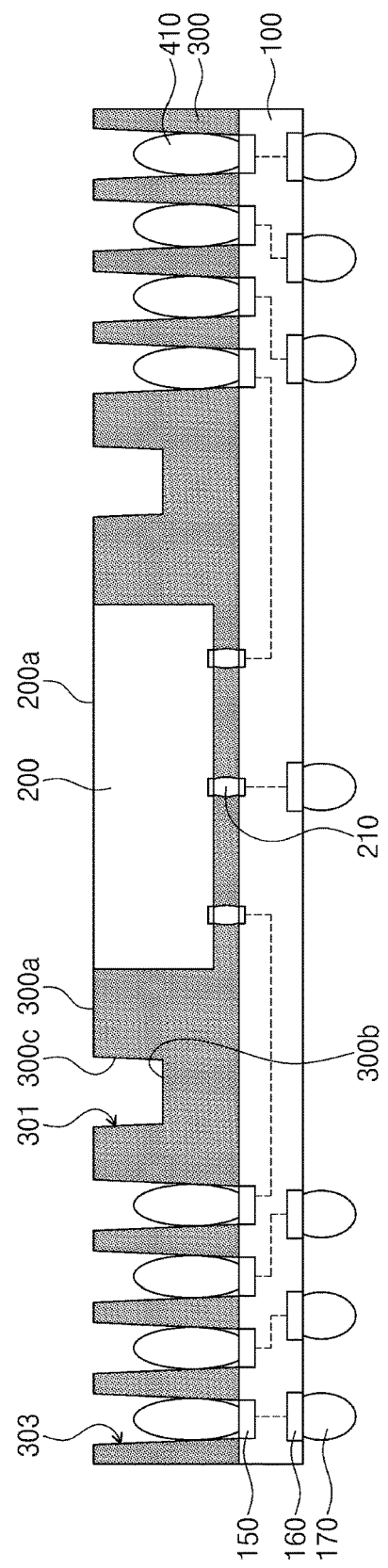
FIGS. 2A, 2B, 2C, and 2E are sectional views illustrating a method of fabricating a first semiconductor package, according to some embodiments of the inventive concepts.

Referring to FIGS. 1 and 2A, a first semiconductor chip 200 and a first mold layer 300 may be provided on a first substrate 100. The first semiconductor chip 200, first mold layer 300, and first substrate 100 may comprise a first semiconductor package of a package-on-package device. The first substrate 100 may be a package substrate, such as a printed circuit board (PCB) with circuit patterns. In certain embodiments, a redistribution layer, instead of the PCB, may be used as the first substrate 100. The first substrate 100 may include first substrate pads 150 and a second substrate pads 160. The first substrate pads 150 and the second substrate pads 160 may be provided on top and bottom surfaces, respectively, of the first substrate 100. The various pads of a device or substrate described herein may be conductive terminals connected to internal wiring of the device or substrate respectively, and may transmit signals and/or supply voltages between an internal wiring and/or internal circuit of the device or substrate and an external source or to another device or substrate. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device or substrate and may generally have a planar surface area (often larger than a corresponding surface area of the internal wiring to which they are connected) to promote connection to a further terminal, such as a bump or solder ball, and/or an internal or external wiring. Each second substrate pad 160 may be connected to at least one of the first substrate pads 150 through an internal wire. In the drawings, a dotted line in the first substrate 100 schematically illustrates such an internal wire in the first substrate 100. An outer terminal 170 may be provided on a bottom surface of the second substrate pad 160. The outer terminal 170 may be an external connection terminal for connecting the first semiconductor package to a device outside of the first semiconductor package (e.g., to a module board or other board). The outer terminal 170 may be formed of or include a conductive material and may be provided, for example, in the form of a bump or ball, such as a solder ball.

The first semiconductor chip 200 may be mounted on the first substrate 100. The first semiconductor chip 200 may be electrically connected to the first substrate 100 through connecting portions 210. The connecting portions 210 may be provided between the first substrate 100 and the first semiconductor chip 200. The connecting portions 210 may include at least one of solder balls, bumps, and pillars, and may be formed of a conductive material (e.g., a metal). The connecting portions 210, in one embodiment, connect to chip pads of the first semiconductor chip 200 and substrate pads of the first substrate 100. The first semiconductor chip 200 may include integrated circuits (not shown), which are adjacent to a bottom surface of the first semiconductor chip 200 (e.g., an active surface of the first semiconductor chip 200). In some embodiments, the first semiconductor chip 200 may serve as a logic chip. For example, the first semiconductor chip 200 may serve as a non-memory chip (e.g., an application processor).

The first mold layer 300 may be formed on the top surface of the first substrate 100 to cover a side surface of the first semiconductor chip 200. The first mold layer 300 may be extended into a gap region between the first substrate 100 and the first semiconductor chip 200 to seal the connecting portions 210 and to hermetically cover a bottom surface of the first semiconductor chip 200. The first mold layer 300 may be formed to allow a top surface 200a of the first semiconductor chip 200 to be exposed to the outside of the first mold layer 300. The first mold layer 300 may be formed of or include an epoxy molding compound.

The first mold layer 300 may be provided to have guide holes 301 and openings 303. The guide holes 301 and the openings 303 may be formed in the first mold layer 300 by partially removing the first mold layer 300. For example, the guide holes 301, also described as guide receptacles or alignment receptacles, may be formed to have bottom surfaces that are located in the first mold layer 300 and are spaced apart from the top surface of the first substrate 100. The removal of the first mold layer 300 may be performed, for example, using a laser drilling process. Since the guide holes 301 are formed in the first mold layer 300, the first mold layer 300 may have a first top surface 300a, a second top surface 300b, and an inner side surface 300c. The first top surface 300a of the first mold layer 300 may correspond to the uppermost surface of the first mold layer 300. The first top surface 300a of the first mold layer 300 may not be exposed to the drilling process, and thus, it may be located at the same level as the top surface 200a of the first semiconductor chip 200. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. The second top surface 300b of the first mold layer 300 may correspond to the bottom surfaces of the guide holes 301. The second top surface 300b of the first mold layer 300 may be located at a level lower than the first top surface 300a. The inner side surface 300c of the first mold layer 300 may connect an edge of the first top surface 300a to an edge of the second top surface 300b. The inner side surface 300c of the first mold layer 300 may be side surfaces of the guide holes 301, also described as sidewalls of the guide holes 301. The guide holes 301 may be spaced apart from the first semiconductor chip 200, for example, in a horizontal direction, so that part of the first mold layer 300 is between a side surface of the first semiconductor chip 200 and each guide hole 301. As shown in FIG. 1, each of the guide holes 301 may have a circular shape, as viewed from a top-down view, but the inventive concepts are not limited thereto. For example, the shape of each of the guide holes 301 may be one of various polygonal shapes (e.g., tetragonal or hexagonal shapes). Also, the guide holes 301 may have an elongated shape to extend lengthwise in a direction into the page in the example cross-sectional FIGS. 2A-2D, or may have a ring shape surrounding the entire first semiconductor chip 200.

The openings 303 may be formed to penetrate the first mold layer 300 and to expose the first substrate pads 150 (e.g., to the outside of the first semiconductor chip 200). The openings 303 may be spaced apart from the guide holes 301 and the first semiconductor chip 200 (e.g., in a horizontal direction), when viewed in a plan view. Lower solder balls 410, described more generally as lower connection terminals, may be formed in the openings 303 and may be coupled to and contact the first substrate pads 150. As used herein, "contact" refers to two components connected with no intervening components present (e.g., touching). The lower solder balls 410 may be electrically connected to the outer terminal 170 or the first semiconductor chip 200. The lower solder balls 410 may be formed of or include at least one of conductive materials (e.g., tin, lead, silver, or alloys thereof). In certain embodiments, solder pastes, instead of the lower solder balls 410, may be provided in the openings 303.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 2B:
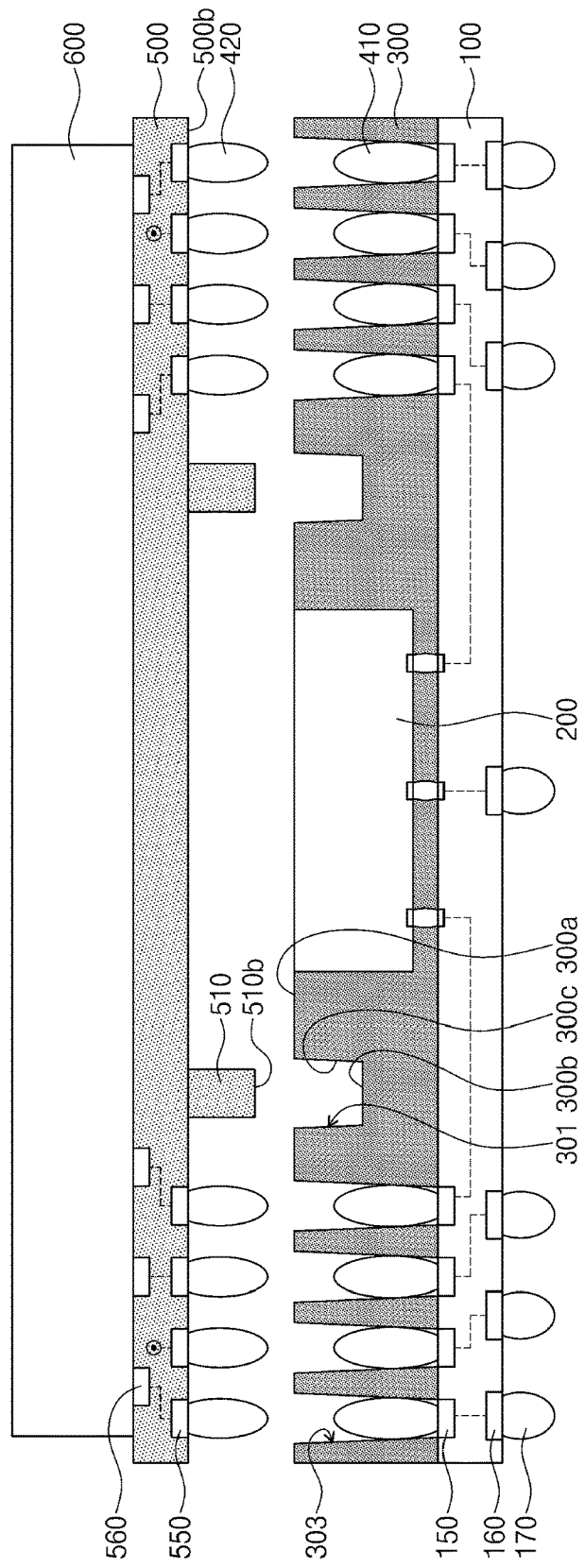

Referring to FIGS. 1 and 2B, an interposer substrate 500 may be provided on the first substrate 100. A bottom surface 500b of the interposer substrate 500 may be provided to face the first semiconductor chip 200. The interposer substrate 500 may be formed of or include, for example, an insulating resin. As an example, the insulating resin may include a solder resist material (e.g., photo-sensitive polyimide), but the inventive concepts are not limited thereto.

First pads 550 (e.g., first interposer pads) may be provided on the bottom surface 500b of the interposer substrate 500, and second pads 560 (e.g., second interposer pads) may be provided on the top surface of the interposer substrate 500. Conductive lines, such as wires may be provided in the interposer substrate 500 to electrically connect the second pads 560 and the first pads 550 to each other. A dotted line in the interposer substrate 500 schematically illustrates such a wire in the interposer substrate 500. Each of the first pads 550, the wires, and the second pads 560 may be formed of or include a conductive or metallic material (e.g., copper or aluminum). Upper solder balls 420, more generally referred to as upper connection terminals, may be formed on bottom surfaces of the first pads 550 and may be coupled to and contact the first pads 550. The upper solder balls 420 may be formed of or include at least one of conductive materials (e.g., tin, lead, silver, or alloys thereof). In one embodiment, the number or the arrangement of the upper solder balls 420 may be different from those of the second pads 560. For example, when viewed in a plan view, the upper solder balls 420 may not overlap the second pads 560. The interposer substrate 500 may be provided on the first substrate 100 in such a way that the upper solder balls 420 are aligned with the lower solder balls 410, respectively.

The interposer substrate 500 may include first protruding portions 510, which protrude from and extend beyond the bottom surface 500b of the interposer substrate 500. In some embodiments, at least two first protruding portions 510 may be provided. In some embodiments, an insulating resin film may be attached to the interposer substrate 500, thereby forming the first protruding portions 510. The insulating resin film may be formed of or include the same material as the interposer substrate 500. The resin for the first protruding portions 510 may be the same as the resin for the interposer substrate 500. For example, the first protruding portions 510 may be formed of or include a solder resist material. In some embodiments, a single insulating layer may be used as the interposer substrate 500, and the first protruding portions 510 may be formed of the same material as the insulating layer. In certain embodiments, the interposer substrate 500 may include a plurality of insulating layers, and the first protruding portions 510 may be formed of the same material as the lowermost layer of the insulating layers in the interposer substrate 500. In one embodiment, the first protruding portions 510 may be integrally formed as part of the interposer substrate 500. The first protruding portions 510 may be referred to as protrusions, or as alignment protrusions.

Depending on their shape, the first protruding portions 510 may be in the form of posts or pillars, or bars, and the shape, from a top-down view, of first protruding portions 510 may match the shape, from a top-down view, of the guide holes 301. The first protruding portions 510 may be smaller in horizontal dimensions than the guide holes 301, so that they can fit inside the guide holes 301, horizontally.

Bottom surfaces 510b of the first protruding portions 510 may be positioned at a level lower than the bottom surface 500b of the interposer substrate 500. The first protruding portions 510 may be spaced apart from the first semiconductor chip 200 and the upper solder balls 420, when viewed in a plan view. The first protruding portions 510 may be vertically aligned with the guide holes 301.

A warpage-prevention unit 600 may be provided on the interposer substrate 500. As an example, a dumbbell may be used as the warpage-prevention unit 600, but the inventive concepts are not limited thereto. The warpage-prevention unit 600 may be, for example, a block of weighted material (e.g., a warpage-prevention block, formed of a metal, insulator, or other material that has a particular thickness so that it has a very low likelihood of warpage), that adds weight during the manufacturing process to the interposer substrate 500 when connecting upper solder balls 420 to lower solder balls 410.

Figure 2C:
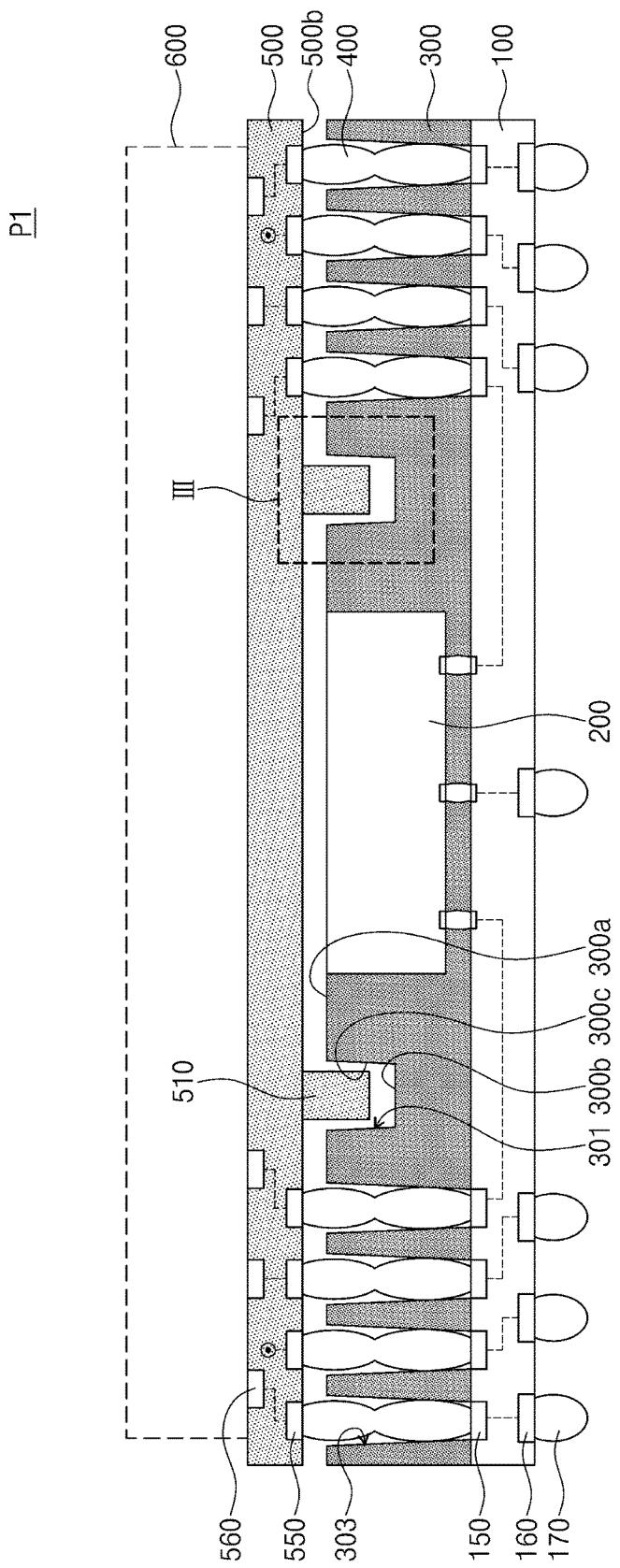
Figure 2D:
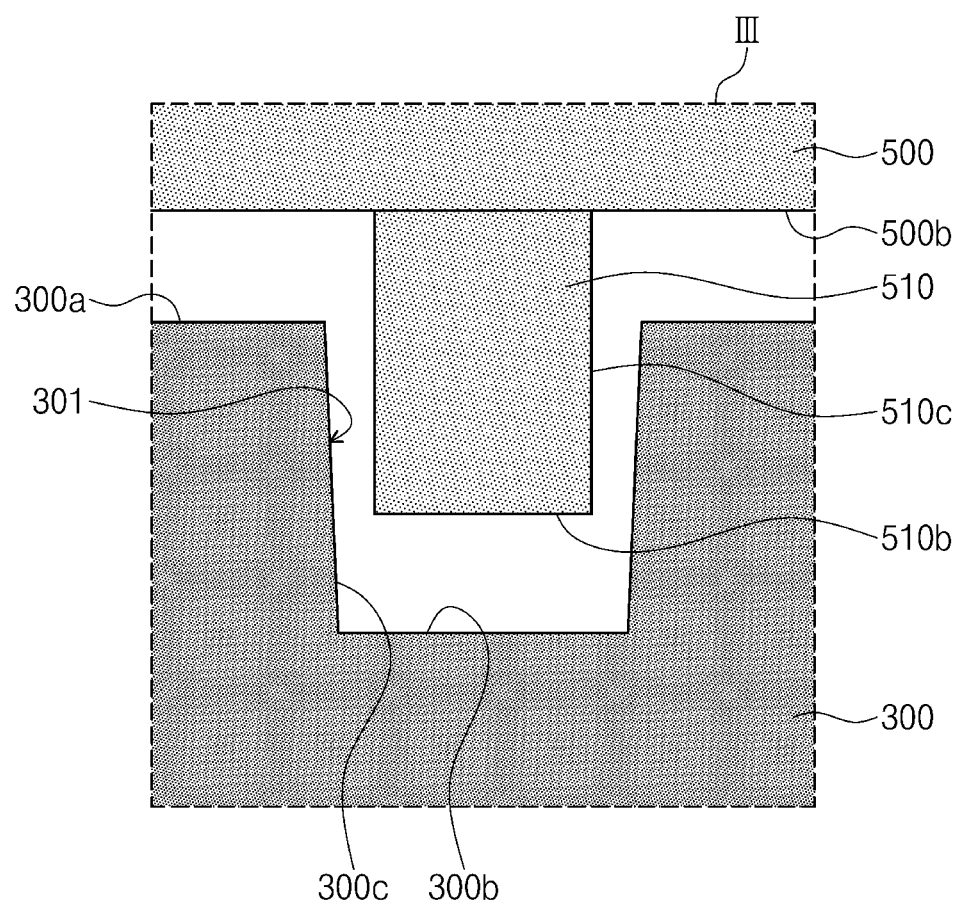
FIG. 2D is an enlarged sectional view illustrating a portion 'III' of FIG. 2C, according to one embodiment.

Referring to FIGS. 1, 2C, and 2D, a reflow process may be performed on the first substrate 100 and the interposer substrate 500 to form solder structures 400. In some embodiments, the reflow process may be performed at a process temperature, which is higher than melting points of the lower solder balls 410 and the upper solder balls 420. For example, the reflow process may be performed at a process temperature ranging from about 200° C. to about 250° C. As a result of the reflow process, the lower solder balls 410 and the upper solder balls 420 may be melted to form the solder structures 400. The solder structures 400 may be coupled to the first substrate pads 150 and the first pads 550 (e.g., interposer pads). The process temperature of the reflow process may be lower than melting points of the first mold layer 300 and the first protruding portions 510. As shown in FIG. 1, the first protruding portions 510 may overlap the guide holes 301, when viewed in a plan view. During the reflow process, the first protruding portions 510, also described as alignment protrusions, may be provided in the guide holes 301 of the first mold layer 300 to prevent the interposer substrate 500 from being undesirably shifted. The first protruding portions 510 and a first guide portion 310 will be described in more detail below.

In the case where the lower solder balls 410 and the upper solder balls 420 are melted by the reflow process, the interposer substrate 500 may be lowered down. The first protruding portions 510 may be contained in the guide holes 301, respectively. As shown in FIG. 2D, the bottom surfaces 510b of the first protruding portions 510 may be positioned at a level lower than the first top surface 300a of the first mold layer 300. The bottom surfaces 510b of the first protruding portions 510 may be positioned at a level, which is equal to or higher than the second top surface 300b of the first mold layer 300. At least portions of side surfaces 510c of the first protruding portions 510 may face the inner side surface 300c of the first mold layer 300. Since the first protruding portions 510 and the guide holes 301 prevent the interposer substrate 500 from being shifted during the reflow process, the upper solder balls 420 may be precisely aligned and effectively connected to the lower solder balls 410, respectively. Thus, the solder structures 400 may be formed satisfactorily. For example, it may be possible to prevent misalignment and non-wetting issues between the upper solder balls 420 and the lower solder balls 410.

Due to its weight, the warpage-prevention unit 600 may exert a downward force on the interposer substrate 500, during the reflow process. However, if the downward force leads to an unintended shift of the interposer substrate 500, the use of the warpage-prevention unit 600 may be restricted. According to some embodiments of the inventive concepts, by virtue of the presence of the first protruding portions 510 and the guide holes 301, it may be possible to use the warpage-prevention unit 600 in a process of fabricating a semiconductor package. Accordingly, it may be possible to prevent the warpage of the interposer substrate 500 from occurring in the reflow process. If the solder structures 400 are cooled down to a room temperature of about 25° C. after the reflow process, the warpage-prevention unit 600 may be removed. As a result of the aforedescribed method, a first semiconductor package P1 may be fabricated.

Figure 2E:
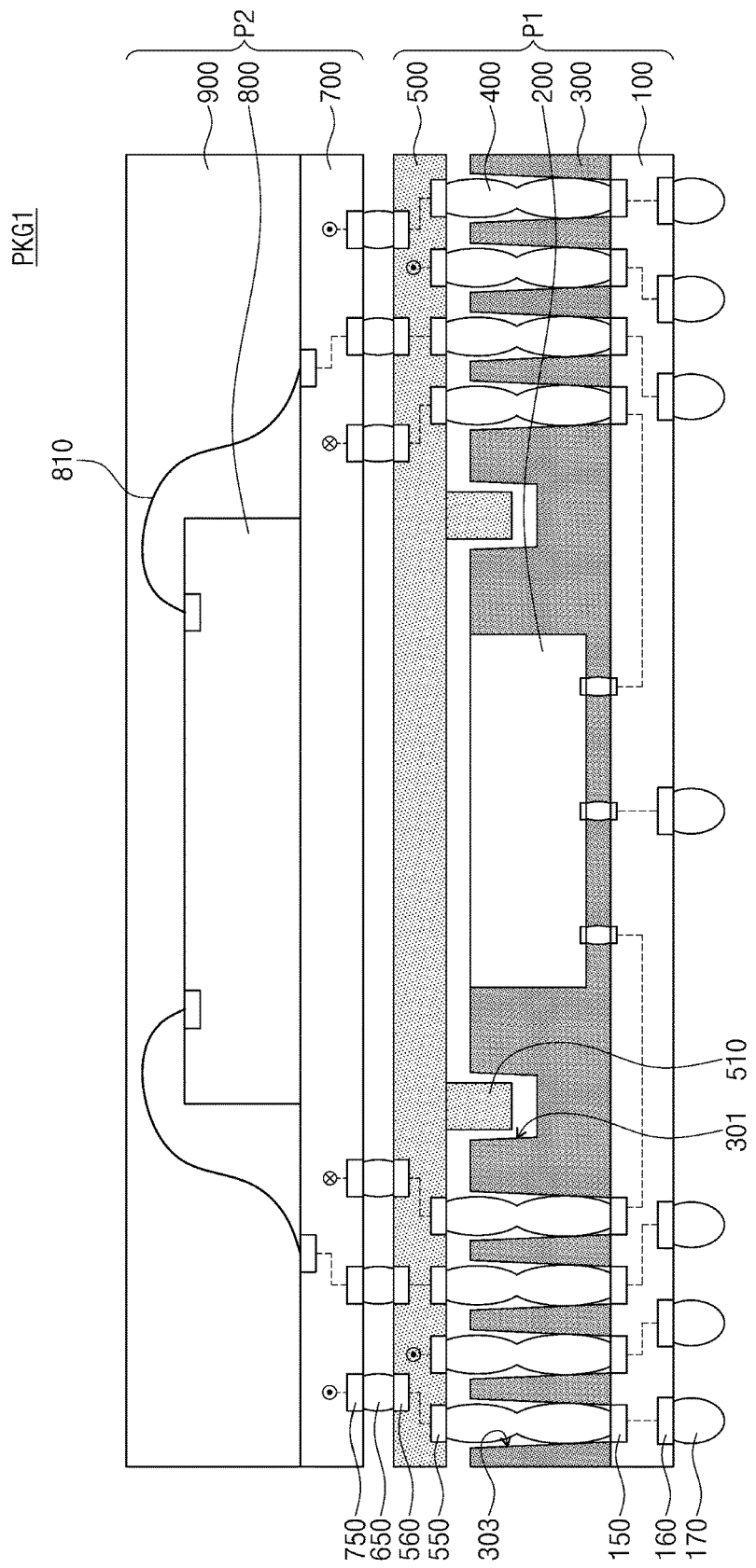

Referring to FIGS. 1 and 2E, a second semiconductor package P2 may be mounted on the first semiconductor package P1, and as a result, a stacked package PKG1 (e.g., package-on-package device) may be fabricated. The first semiconductor package P1 may be a package fabricated by the method previously described with reference to FIGS. 2A to 2C. The second semiconductor package P2 may include a second substrate 700 (e.g., package substrate), a second semiconductor chip 800, and a second mold layer 900. The second substrate 700 may include lower substrate pads 750 provided on a bottom surface thereof. The second substrate 700 may be formed of, for example, of a PCB.

The second semiconductor chip 800 may be electrically connected to the second substrate 700 through a bonding wire 810. In certain embodiments, the second semiconductor chip 800 may be mounted on the second substrate 700 in a flip-chip manner, and so bonding wires are not used. The second semiconductor chip 800 may have a function different from that of the first semiconductor chip 200. For example, the second semiconductor chip 800 may serve as a memory chip. One or more second semiconductor chips 800 may be provided as part of the second semiconductor package P2. A circuit in the second substrate 700 may be configured in consideration of a mounting method, a type, a size, and/or the number of the second semiconductor chip 800.

Interconnection terminals 650 may be provided between the interposer substrate 500 and the second substrate 700 and may be coupled to the second pads 560 and the lower substrate pads 750. Since the interposer substrate 500 is used, the arrangement and the number of the interconnection terminals 650 may not be limited by the arrangement and the number of the solder structures 400. For example, the arrangement and the number of the interconnection terminals 650 may be different from those of the solder structures 400. This may make it possible to diversify the first semiconductor chip 200 and the second semiconductor chip 800 in terms of number, size, mounting method, and arrangement. Furthermore, it may be possible to design circuits in the second substrate 700 with increased freedom. The second mold layer 900 may be formed on the second substrate 700 to seal the second semiconductor chip 800.

Figure 3A:
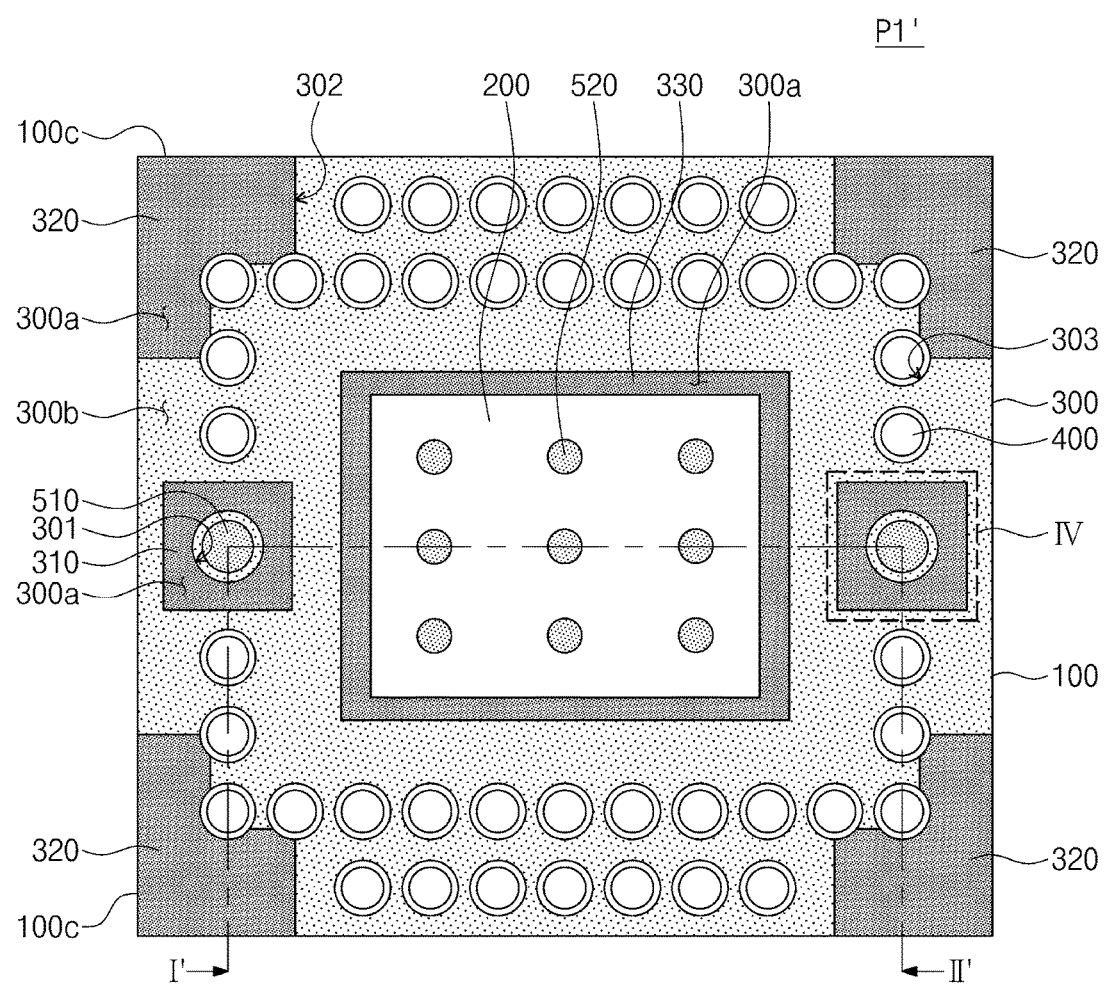
FIG. 3A is a plan view illustrating a first semiconductor package according to some embodiments of the inventive concepts.
Figure 3B:
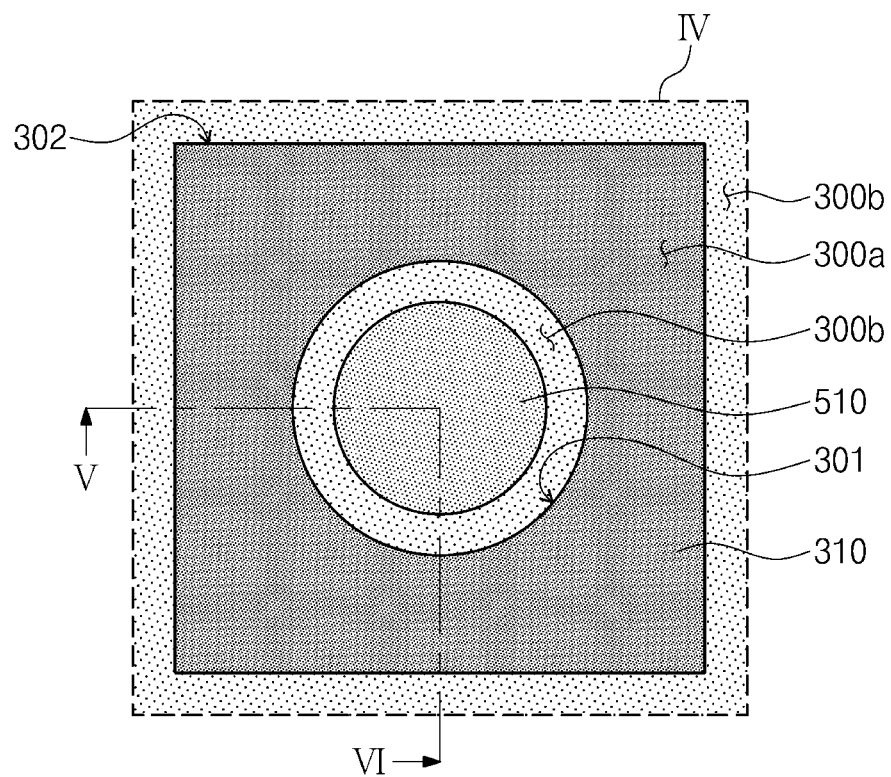
FIG. 3B is an enlarged plan view illustrating a portion 'IV' of FIG. 3A, according to one embodiment.

FIG. 3A is a plan view illustrating a first semiconductor package according to some embodiments of the inventive concepts. FIG. 3B is an enlarged plan view illustrating a portion 'IV' of FIG. 3A. FIGS. 4A, 4B, 4C, and 4E are sectional views illustrating a method of fabricating a first semiconductor package, according to some embodiments of the inventive concepts, taken along line I'-II' of FIG. 3A. FIG. 4D is an enlarged sectional view of a portion 'III' of FIG. 4C, taken along line V-VI of FIG. 3B. For concise description, an element previously described with reference to FIG. 1 may be identified by a similar or identical reference number without repeating an overlapping description thereof.

Figure 4A:
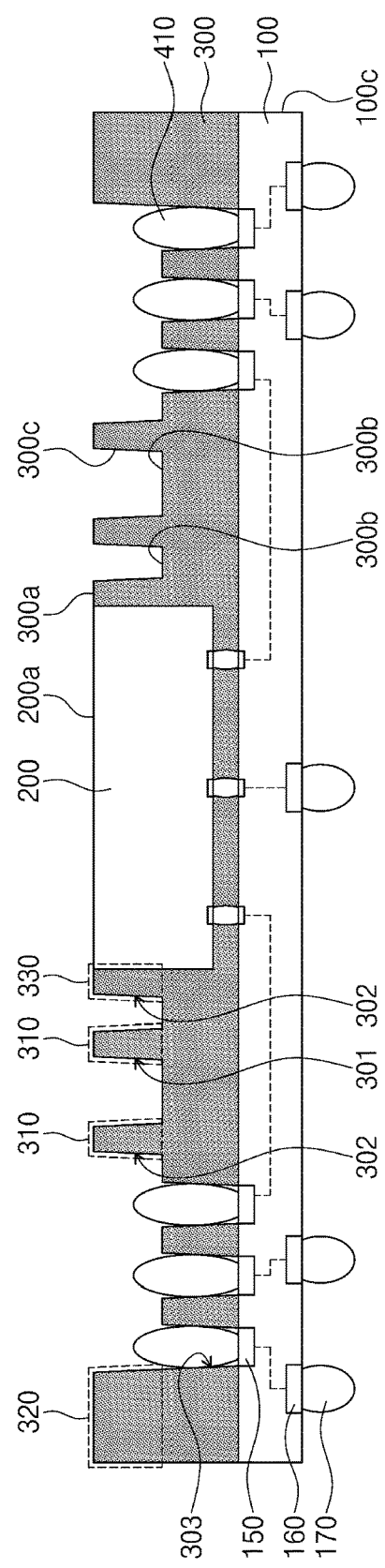
FIGS. 4A, 4B, 4C, and 4E are sectional views illustrating a method of fabricating a first semiconductor package, according to some embodiments of the inventive concepts.

Referring to FIGS. 3A, 3B, and 4A, the first semiconductor chip 200 and the first mold layer 300 may be formed on the first substrate 100. The first substrate 100, the first semiconductor chip 200, and the first mold layer 300 may be configured to have substantially the same features as those described with reference to FIGS. 1 and 2A. For example, a portion of the first mold layer 300 may be removed by the laser drilling process, thereby forming the guide holes 301 and the openings 303. Unlike that shown in FIGS. 1 and 2A, the first mold layer 300 may have a trench 302 formed in a top surface thereof (e.g., the first top surface 300a). The first mold layer 300 will be described in more detail below.

The trench 302 may be formed by partially removing another portion of the first mold layer 300, and in some embodiments, the removal of the first mold layer 300 may be performed using a laser drilling process. The trench 302 and the guide holes 301 may be formed by the same process, but the inventive concepts are not limited thereto. The trench 302 may be connected to the openings 303. In some embodiments, the trench 302 may be formed in the first mold layer 300 to define a chip sealing portion 330, a first guide portion 310, and a second guide portion 320.

The first mold layer 300 may have the first top surface 300a and the second top surface 300b, which is located at a level lower than the first top surface 300a. The first top surface 300a of the first mold layer 300 may include a top surface of the chip sealing portion 330, a top surface of the first guide portion 310, and a top surface of the second guide portion 320. The second top surface 300b of the first mold layer 300 may include bottom surfaces of the guide holes 301 and a bottom surface of the trench 302.

The first mold layer 300 may include the chip sealing portion 330, the first guide portion 310, and the second guide portion 320. The chip sealing portion 330 may be provided to cover a side surface of the first semiconductor chip 200 and to seal the first semiconductor chip 200. The chip sealing portion 330 may have a top surface, which is located at the same level as the top surface 200a of the first semiconductor chip 200. The chip sealing portion 330 may have an upward protruding shape (e.g., higher than the second top surface 300b of the first mold layer 300).

The first guide portion 310 may have an upward protruding shape (e.g., higher than the second top surface 300b of the first mold layer 300). As shown in FIG. 3A, the first guide portion 310 may be spaced apart from the first semiconductor chip 200, when viewed in a plan view. The first guide portion 310 may have at least one of the guide holes 301. Unlike that illustrated in the drawings, the first guide portion 310 may be provided to have a plurality of guide holes 301. The first guide portion 310 is illustrated to have a rectangular shape, but the shape of the first guide portion 310 may be variously changed. For example, the first guide portion 310 may be provided to have a circular, elliptical, or hexagonal shape.

The second guide portion 320 may have an upward protruding shape (e.g., higher than the second top surface 300b of the first mold layer 300). The second guide portion 320 may be spaced apart from the first semiconductor chip 200. As shown in FIG. 4A, the second guide portion 320 may be provided on an edge portion of the first mold layer 300, when viewed in a plan view. The second guide portion 320 may be shaped like a letter "L" or a rotated letter "L", when viewed in a plan view. In certain embodiments, the second guide portion 320 may be shaped like a bar extending parallel to an outer side surface 100c of the first substrate 100, when viewed in a plan view.

Figure 4B:
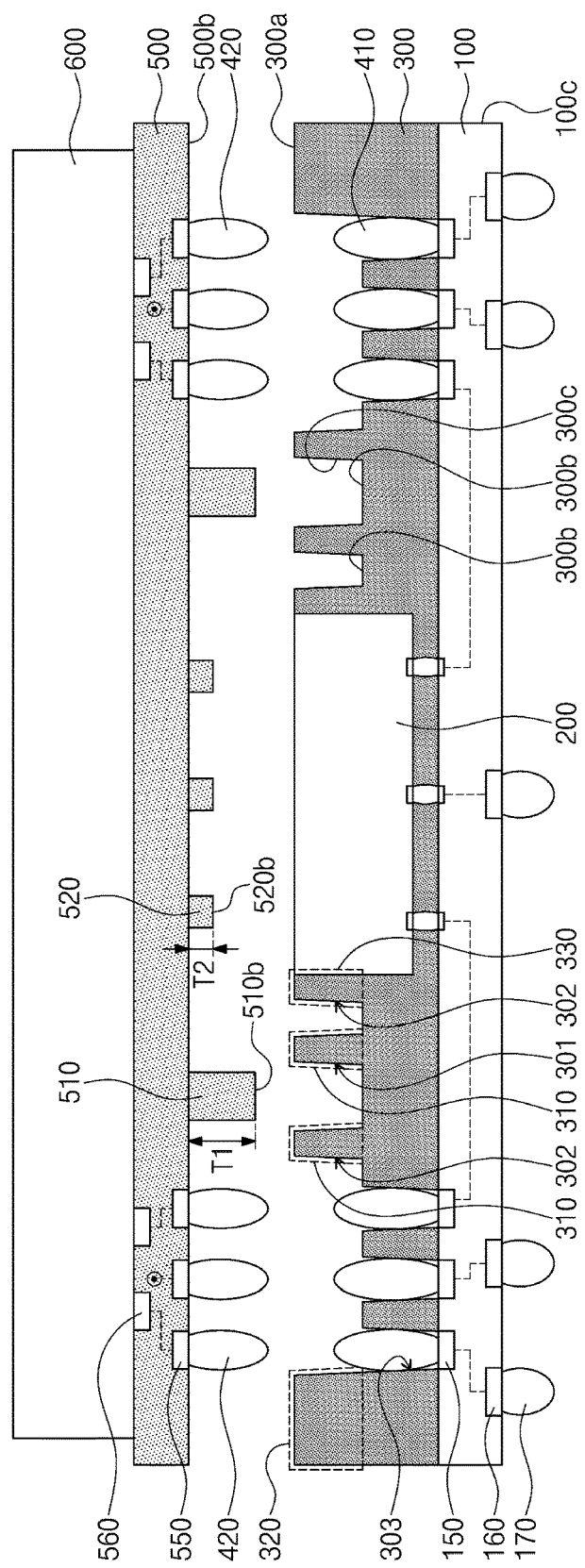
Figure 4C:
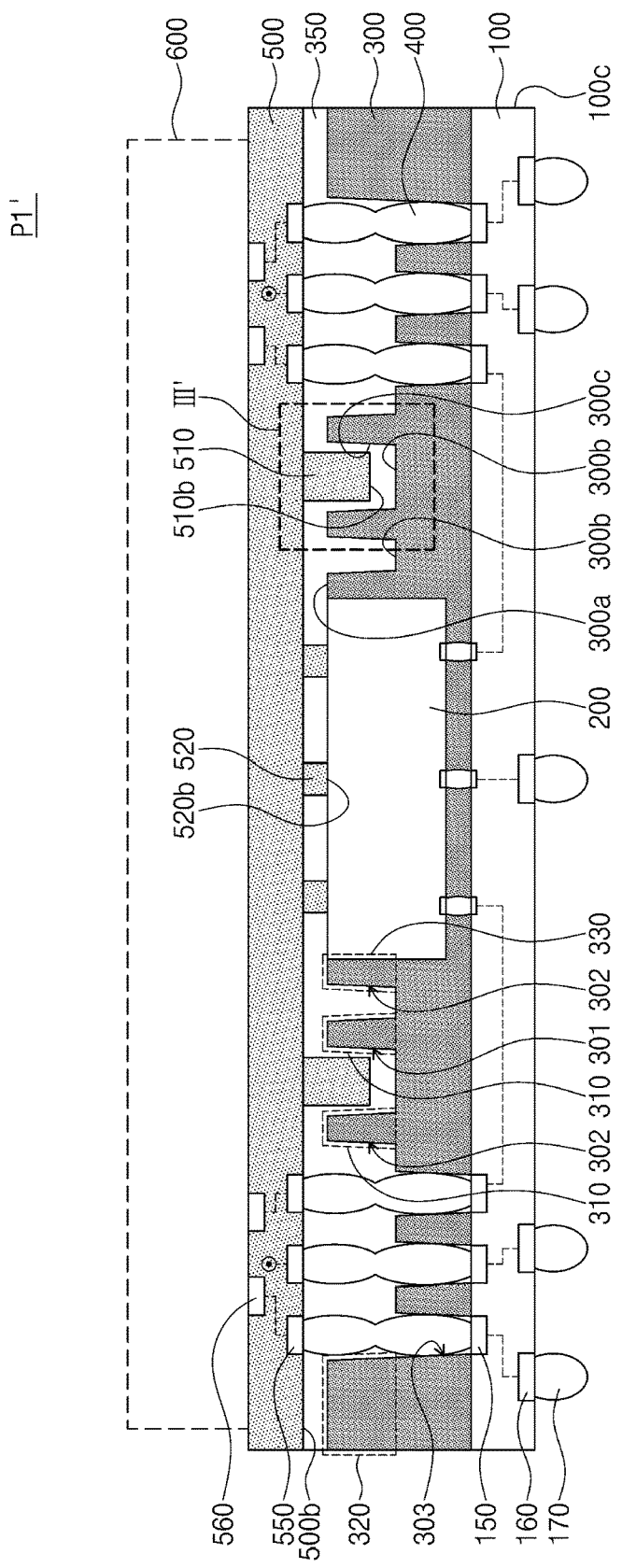
Figure 4D:
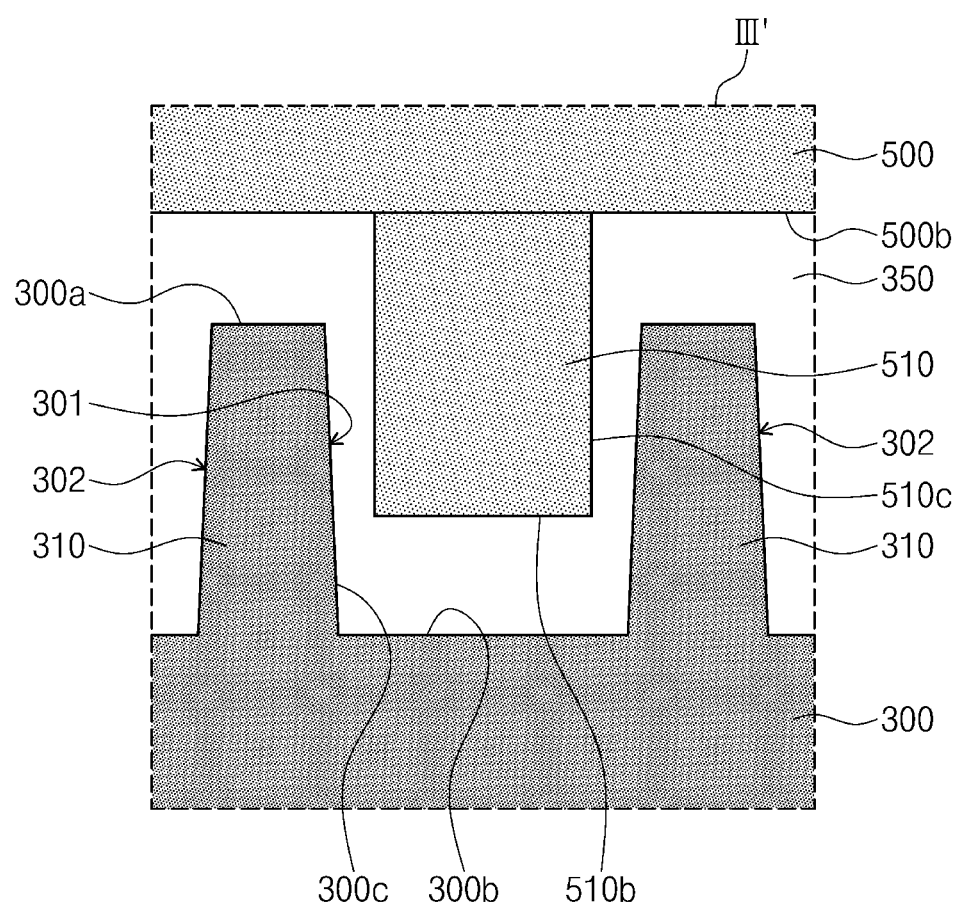
FIG. 4D is an enlarged sectional view of a portion 'III'' of FIG. 4C, taken along line V-VI of FIG. 3B, according to one embodiment.

Referring to FIGS. 3A, 3B, and 4B, the interposer substrate 500 may be provided on the first substrate 100. The second pads 560 may be provided on a top surface of the interposer substrate 500. Upper connection terminals, such as the upper solder balls 420, and the first pads 550 may be provided on the bottom surface 500b of the interposer substrate 500. The interposer substrate 500 may be configured to include second protruding portions 520, in addition to the first protruding portions 510. The first protruding portions 510 may be configured to have substantially the same features as the first protruding portions 510 of FIG. 2B.

The second protruding portions 520 may be provided on the bottom surface 500b of the interposer substrate 500, and may include one or more two protruding portions (e.g., protrusions). In certain embodiments, at least two second protruding portions 520 are included. As shown in FIG. 3A, the second protruding portions 520 may overlap with the first semiconductor chip 200, when viewed in a plan view. As shown in FIG. 4B, thicknesses T1 (e.g., vertical thicknesses or lengths) of the first protruding portions 510 may be greater than thickness T2 of the second protruding portions 520. A bottom surface 520b of the second protruding portions 520 may be located at a level, which is lower than the bottom surface 500b of the interposer substrate 500 and is higher than the bottom surfaces 510b of the first protruding portions 510.

The second protruding portions 520 may be formed of or include the same insulating material as the interposer substrate 500. The resin for the second protruding portions 520 may be the same as the resin for the interposer substrate 500.

The second protruding portions 520 may be formed of or include, for example, a solder resist material. The second protruding portions 520 may be referred to as protrusions. In some embodiments, a single insulating layer may be used as the interposer substrate 500, and the second protruding portions 520 may be formed of or include the same material as the insulating layer. In certain embodiments, the interposer substrate 500 may include a plurality of insulating layers, and the second protruding portions 520 may be formed of or include the same material as the lowermost layer of the insulating layers in the interposer substrate 500. The second protruding portions 520 may be formed of or include the same material as the first protruding portions 510.

The interposer substrate 500 may be provided on the first semiconductor chip 200 and the first mold layer 300 in such a way that the upper solder balls 420 are aligned with the lower solder balls 410. Here, the first protruding portions 510 of the interposer substrate 500 may be respectively aligned with the guide holes 301 of the first mold layer 300. The warpage-prevention unit 600 may be provided on the interposer substrate 500.

Referring to FIGS. 3A, 3B, 4C, and 4D, a reflow process may be performed on the first substrate 100 and the interposer substrate 500 to form the solder structures 400. The reflow process may be performed by substantially the same method as that described with reference to FIG. 2C.

As a result of the reflow process, the lower solder balls 410 and the upper solder balls 420 may be melted to allow the interposer substrate 500 to be lowered down. Thus, at least a portion of each of the first protruding portions 510 may be located in a corresponding one of the guide holes 301. As shown in FIG. 4D, the bottom surfaces 510b of the first protruding portions 510 may be positioned at a level lower than the first top surface 300a of the first mold layer 300. The bottom surfaces 510b of the first protruding portions 510 may be located at a level, which is equal to or higher than the second top surface 300b of the first mold layer 300. At least portions of side surfaces 510c of the first protruding portions 510 may face the inner side surface 300c of the first mold layer 300. The first protruding portions 510 and the guide holes 301 may prevent the interposer substrate 500 from being shifted during the reflow process.

As shown in FIG. 3A, the second guide portion 320 may be provided between the outermost solder structures 400 and the outer side surface 100c of the first substrate 100. Here, the outermost solder structures 400 may refer to some of the solder structures 400 that are located most adjacent to the outer side surface 100c of the first substrate 100. Since the second guide portion 320 is provided, it may be possible to prevent misalignment and non-wetting issues between the upper solder balls 420 and the lower solder balls 410. This may make it possible to satisfactorily form the solder structures 400. For example, it may be possible to prevent or suppress a short circuit from being formed between the solder structures 400.

In the reflow process, the extent of the lowering of the interposer substrate 500 may be controlled by the second protruding portions 520. After the reflow process, the bottom surface 520b of the second protruding portions 520 may contact the top surface 200a of the first semiconductor chip 200. The second protruding portions 520 may be configured to support the interposer substrate 500 and to uniformly maintain a space between the first semiconductor chip 200 and the interposer substrate 500. If the solder structures 400 are cooled down to a room temperature after the reflow process, the warpage-prevention unit 600 may be removed.

An under-fill material may be provided between the first mold layer 300 and the interposer substrate 500 and between the first mold layer 300 and the first semiconductor chip 200 to form an under-fill layer 350. The under-fill layer 350 may be extended into the trench 302 and the openings 303 to seal the solder structures 400. In some embodiments, a gap between the first semiconductor chip 200 and the interposer substrate 500 may be uniformly maintained by the second protruding portion 520, and thus, spaces between the first mold layer 300 and the interposer substrate 500 and between the first mold layer 300 and the first semiconductor chip 200 may be effectively filled with the under-fill layer 350. As shown in FIG. 4D, the under-fill layer 350 may be extended into gap regions between the guide holes 301 and the first protruding portions 510. For example, the under-fill layer 350 may be provided to fill gap regions between the side surfaces 510c of the first protruding portions 510 and side surfaces of the guide holes 301 (e.g., the inner side surface 300c of the first mold layer 300). The under-fill layer 350 may be extended into gap regions the bottom surface 510b of the first protruding portions 510 and the bottom surfaces of the guide holes 301 (e.g., the second top surface 300b of the first mold layer 300). In some embodiments, the under-fill layer 350 may be formed of or include a material different from the first mold layer 300. The under-fill layer 350 may be formed of or include, for example, an insulating resin. As a result of the afore-described method, a first semiconductor package P1' may be fabricated.

Figure 4E:
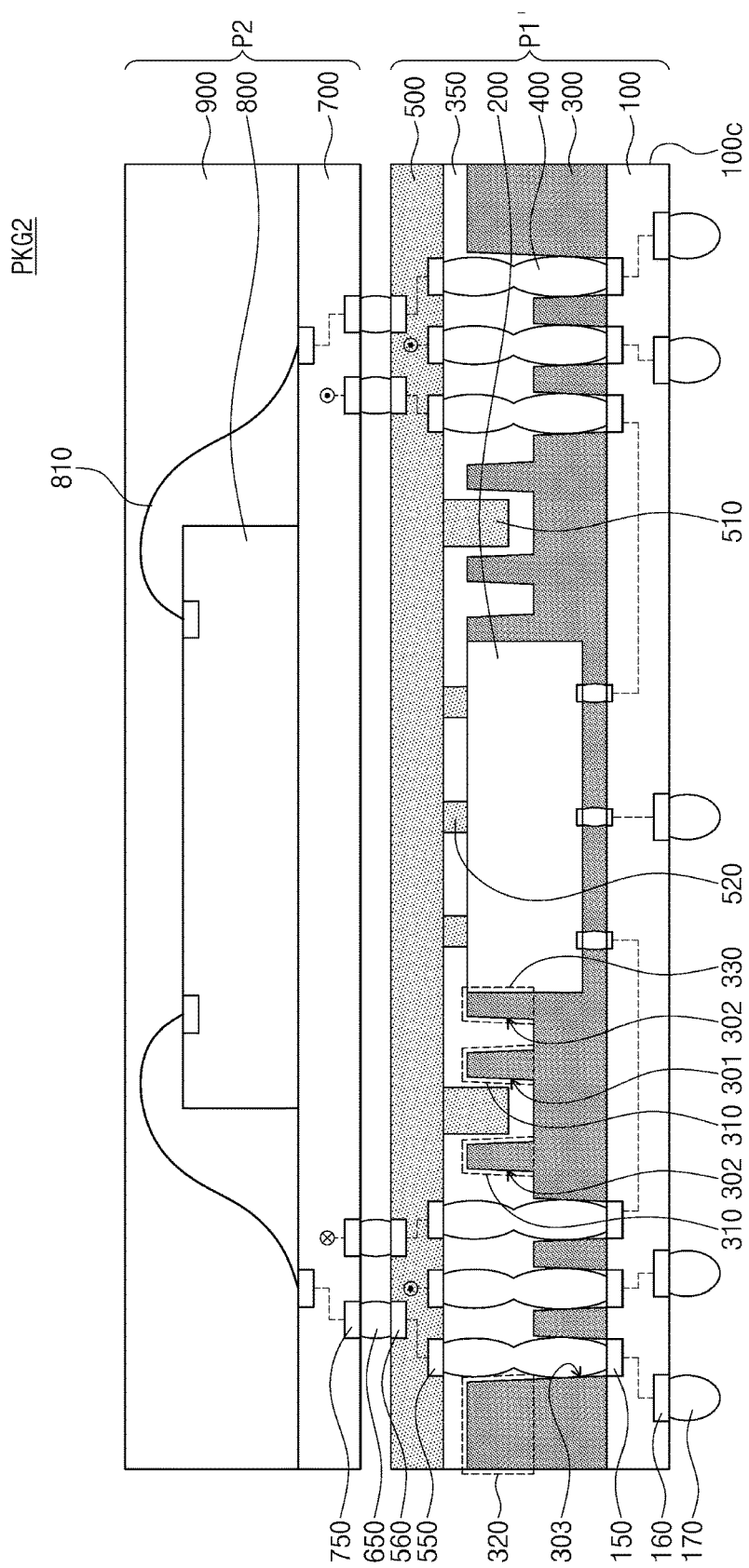

Referring to FIGS. 3A, 3B, and 4E, the second semiconductor package P2 may be mounted on the first semiconductor package P1' to fabricate a stacked package PKG2. The first semiconductor package P1' may be fabricated by the method previously described with reference to FIGS. 4A to 4C. The second semiconductor package P2 may include the second substrate 700, the second semiconductor chip 800, and the second mold layer 900. The second semiconductor chip 800 may be configured to have substantially the same features as that of FIG. 2E. The interconnection terminals 650 may be formed between the interposer substrate 500 and the second substrate 700 and may be coupled to the second pads 560 and the lower substrate pads 750. The second semiconductor chip 800 may be electrically connected to the first semiconductor chip 200 or the outer terminal 170 through the second substrate 700, the interconnection terminals 650, the solder structures 400, and the first substrate 100.

Figure 5A:
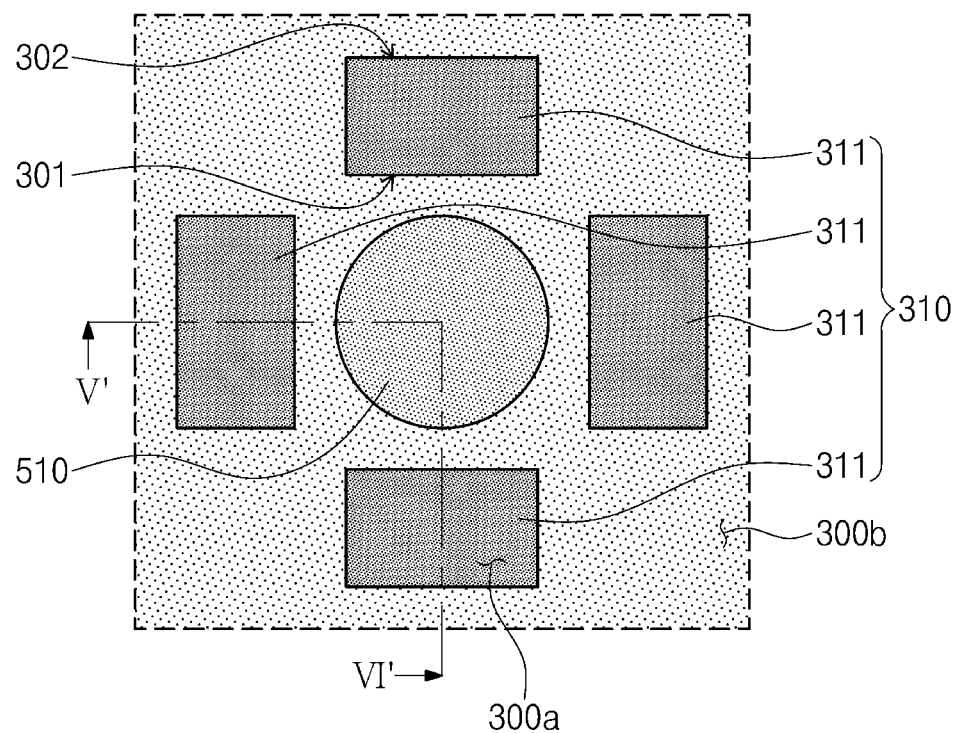
FIG. 5A is a plan view illustrating a first guide portion according to some embodiments of the inventive concepts.
Figure 5B:
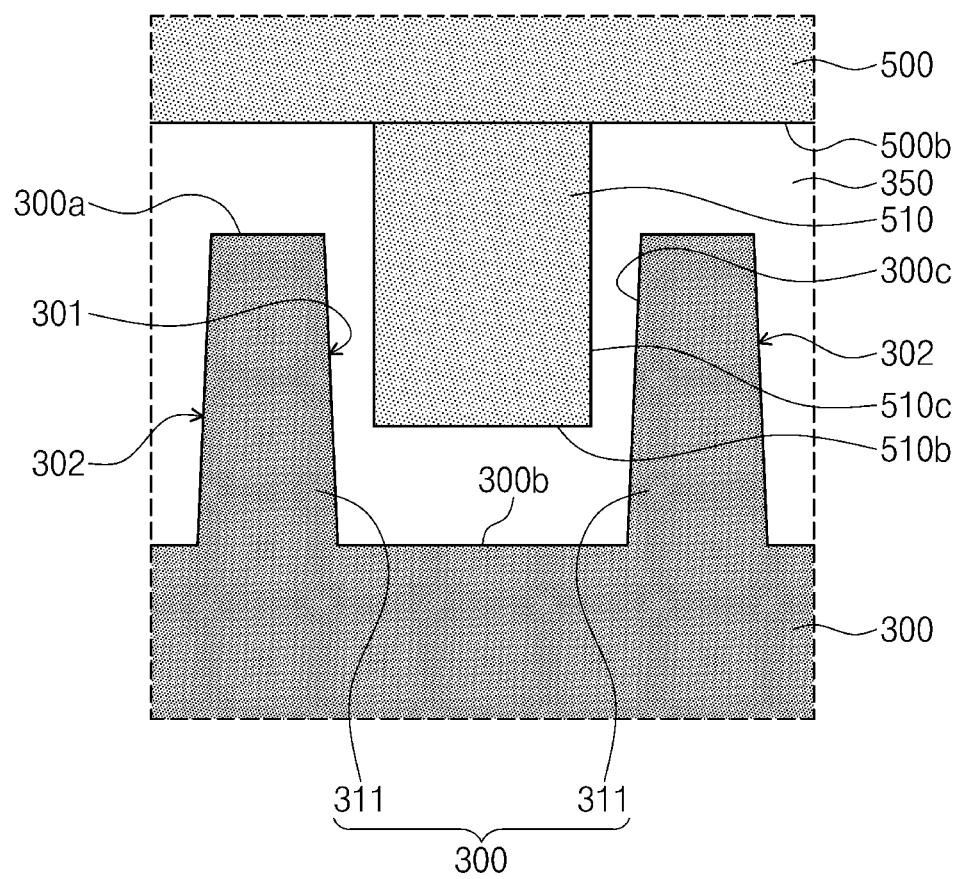
FIG. 5B is a sectional view taken along line V'-VI' of FIG. 5A, according to one embodiment.

FIG. 5A is a plan view illustrating a first guide portion according to some embodiments of the inventive concepts and corresponds to an enlarged plan view of a portion 'IV' of FIG. 3A. FIG. 5B is a sectional view taken along line V'-VI' of FIG. 5A. For the sake of brevity, one of the first protruding portions will be described in the following description of FIGS. 5A and 5B. Also, a previously described element may be identified by a similar or identical reference number without repeating an overlapping description thereof.

Referring to FIGS. 5A and 5B, the first guide portion 310 may include a plurality of sub-guide portions 311. The sub-guide portions 311 may be spaced apart from each other, when viewed in a top-down view. The guide holes 301 may be connected to the trench 302. The first protruding portion 510 may be provided between the sub-guide portions 311. As shown in FIG. 5B, the bottom surface 510b of the first protruding portion 510 may be located at a level that is lower the top surfaces of the sub-guide portions 311 (e.g., the first top surface 300a of the first mold layer 300) and is equal to or lower than the bottom surfaces of the guide holes 301 (e.g., the second top surface 300b of the first mold layer 300). The side surface 510c of the first protruding portion 510 may face the side surface of the sub-guide portions 311 (e.g., the inner side surface 300c of the first mold layer 300). The under-fill layer 350 may be provided to fill a space between the sub-guide portions 311 and the first protruding portion 510. In certain embodiments, the under-fill layer 350 may be omitted.

Figure 6A:
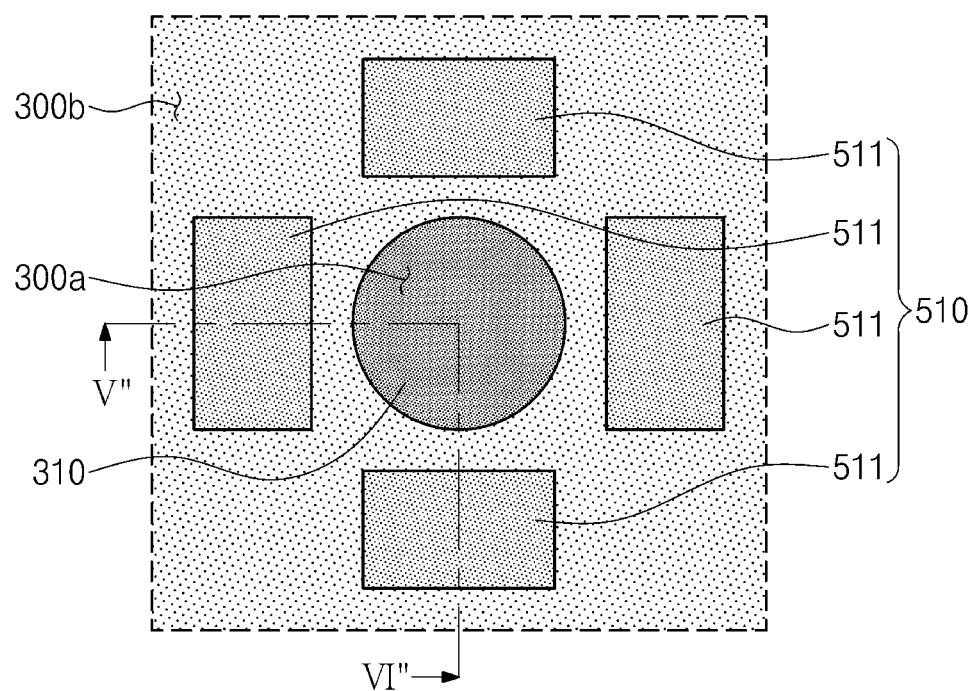
FIG. 6A is a plan view illustrating a first guide portion and a first protruding portion, according to some embodiments of the inventive concepts.
Figure 6B:
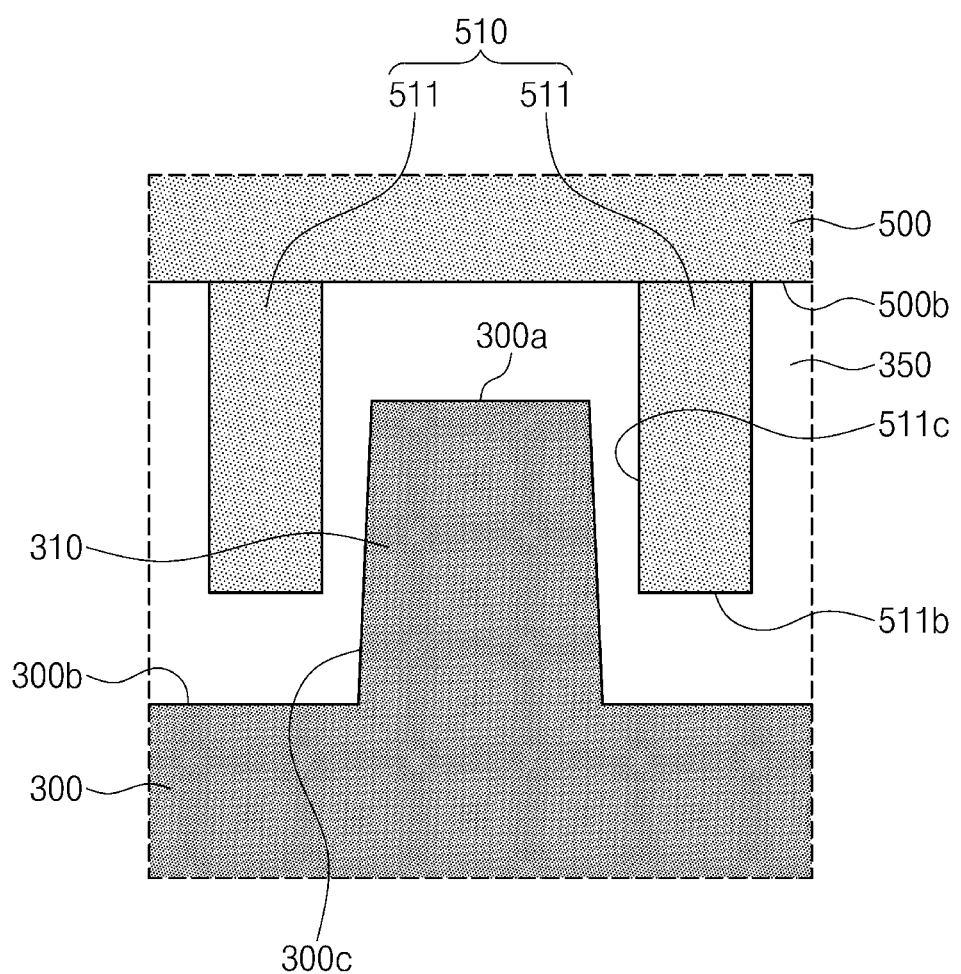
FIG. 6B is a sectional view taken along line V''-VI'' of FIG. 6A, according to one embodiment.

FIG. 6A is a plan view illustrating a first guide portion and a first protruding portion, according to some embodiments of the inventive concepts and corresponds to an enlarged plan view of a portion 'IV' of FIG. 3A. FIG. 6B is a sectional view taken along line V"-VI" of FIG. 6A. For concise description, a previously described element may be identified by a similar or identical reference number without repeating an overlapping description thereof.

Referring to FIGS. 6A and 6B, the first protruding portions 510 may include a plurality of sub-protruding portions 511 that together form an alignment receptacle. The sub-protruding portions 511 may be provided to be spaced apart from each other. The first guide portion 310 may be provided between the sub-protruding portions 511. As shown in FIG. 6B, side surfaces 511c of the sub-protruding portions 511 may face the side surface of the first guide portion 310 (e.g., the inner side surface 300c of the first mold layer 300). Bottom surfaces 511b of the sub-protruding portions 511 may be located at a level, which is lower than the top surface of the first guide portion 310 (e.g., the first top surface 300a of the first mold layer 300). The bottom surface 511b of the sub-protruding portions 511 may be located at a level, which is equal to or higher than the second top surface 300b of the first mold layer 300. The under-fill layer 350 may be provided to fill gap regions between the first guide portion 310 and the sub-protruding portions 511. In certain embodiments, the under-fill layer 350 may be omitted. Also, though not shown, in some embodiments, the protruding portions connected to the interposer substrate 500 in the various other embodiments may form an alignment receptacle performing a similar function as those shown in FIGS. 6A and 6B, and the guide portions connected to the first mold layer 300 in the various embodiments may form an alignment post. Thus, together, the interposer substrate 500 and first mold layer 300 fit together and are aligned by one or more alignment holes formed on one of the interposer substrate 500 and the first mold layer 300, and one or more alignments posts formed on the other of the interposer substrate 500 and the first mold layer 300. Therefore, according to the various embodiments, a guide hole may be formed at one of a top surface of a first mold layer of a first semiconductor package and a bottom surface of a first substrate, such as an interposer substrate or a package substrate of a second semiconductor package. In addition, a first alignment protrusion may be formed at the other of the top surface of the first mold layer and the bottom surface of the first substrate, and at least a portion of the first alignment protrusion may be provided in the guide hole to align solder balls of the first semiconductor package with solder balls of the first substrate.

FIG. 7 is a sectional view illustrating a process of fabricating a first semiconductor package according to some embodiments of the inventive concepts. For concise description, a previously described element may be identified by a similar or identical reference number without repeating an overlapping description thereof.

Referring to FIG. 7, a plurality of the first semiconductor chips 200 may be provided. The first semiconductor chips 200 may be provided on the first substrate 100. The first substrate 100 may be, for example, a strip PCB. The first mold layer 300 may be formed on the first substrate 100 to cover the first semiconductor chips 200. The first mold layer 300 may be configured to have substantially the same features as the first mold layer 300 described with reference to FIG. 4A. For example, the first mold layer 300 may be provided to have the guide holes 301, the trench 302, and the openings 303.

A plurality of the interposer substrates 500 may be prepared. Each of the interposer substrates 500 may be configured to have substantially the same features as the interposer substrate 500 of FIG. 4B. For example, each of the interposer substrates 500 may include the first protruding portions 510 and the second protruding portion 520, which are provided on a bottom surface thereof. The interposer substrates 500 may be provided on the first semiconductor chips 200, respectively. Here, the first protruding portions 510 of the interposer substrate 500 may be respectively aligned with the guide holes 301 of the first mold layer 300.

The solder structures 400 may be formed between the first substrate 100 and the interposer substrates 500 by a reflow process. The under-fill layer 350 may be formed between the first mold layer 300 and the interposer substrate 500 and between the first semiconductor chip 200 and the interposer substrate 500 to seal the solder structures 400.

A sawing process along the dotted lines may be performed on the first substrate 100, the first mold layer 300, and the under-fill layer 350 to form a plurality of first semiconductor packages P1', which are divided from each other. Each of the first semiconductor packages P1' may be configured to have substantially the same features as the first semiconductor package P1' of FIGS. 4C and 4D, and thus may include the first substrate 100 (package substrate), the first semiconductor chip 200, the first mold layer 300, solder structures 400, and interposer substrate 500.

In some embodiments, the fabrication of the first semiconductor package P1 described with reference to FIGS. 2A to 2D may be performed using the strip PCB of FIG. 7 as the first substrate 100.

Figure 8:
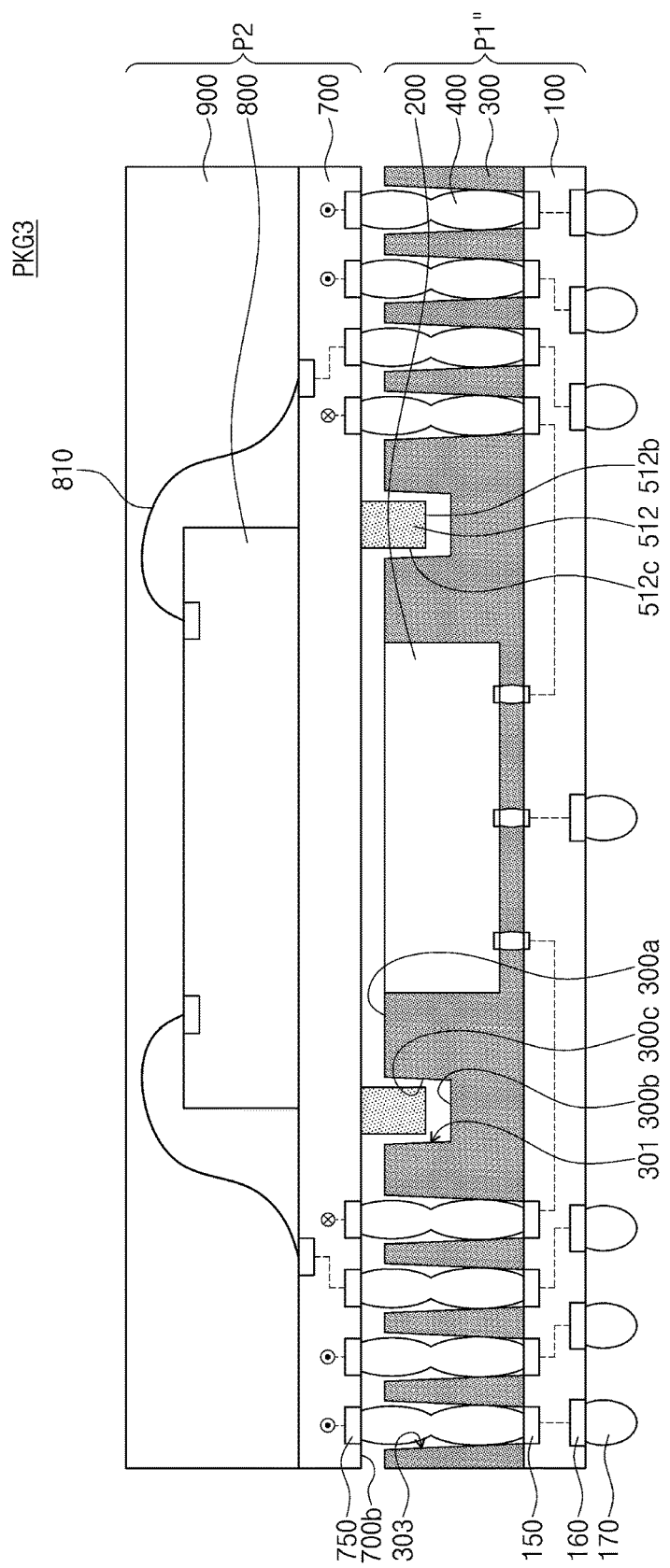
FIG. 8 is a sectional view illustrating a stacked package according to some embodiments of the inventive concepts.

FIG. 8 is a sectional view illustrating a stacked package according to some embodiments of the inventive concepts. For concise description, a previously described element may be identified by a similar or identical reference number without repeating an overlapping description thereof.

Referring to FIG. 8, a stacked package PKG3 may include a first semiconductor package P1'' and the second semiconductor package P2. The first semiconductor package P1'' may include the first substrate 100, the first semiconductor chip 200, and the first mold layer 300. The second semiconductor package P2 may include the second substrate 700, the second semiconductor chip 800, and the second mold layer 900. The first substrate 100, the first semiconductor chip 200, the first mold layer 300, the second substrate 700, the second semiconductor chip 800, and the second mold layer 900 may be configured to have substantially the same features as those described with reference to FIGS. 1 to 2E. However, the interposer substrate 500 may be omitted, and the second substrate 700 may be provided to include protruding portions 512, which are provided on a bottom surface 700b thereof. The protruding portions 512 may be formed of the same material as the second substrate 700, and in some embodiments may be integrally formed as part of the second substrate 700. Alternatively, the protruding portions 512 may be formed of a different material as the second substrate 700. For example, the protruding portions 512 may be formed of an insulative material. The protruding portions 512 may overlap with the guide holes 301 of the first mold layer 300, when viewed in a plan view. The protruding portions 512 may be, at least partially, located in the guide holes 301 of the first mold layer 300. Side surfaces 512c of the protruding portions 512 may be provided to at least partially face the inner side surface 300c of the first mold layer 300. Bottom surfaces 512b of the protruding portions 512 may be located at a level, which is lower than the first top surface 300a of the first mold layer 300 and is equal to or higher than the second top surface 300b of the first mold layer 300. The protruding portions 512 may be spaced apart from the first semiconductor chip 200 and the solder structures 400, when viewed in a plan view.

The solder structures 400 may be provided on the first substrate 100 and in the openings 303 of the first mold layer 300. The solder structures 400 may be coupled to the first substrate pads 150 and the lower substrate pads 750. In the reflow process for forming the solder structures 400, the protruding portions 512 and the guide holes 301 may prevent the second semiconductor package P2 from being undesirably shifted. Accordingly, it may be possible to stably form the solder structures 400 and consequently to improve reliability of the stacked package PKG3.

According to some embodiments of the inventive concepts, first protruding portions may be provided on a bottom surface of a first substrate, such as an interposer substrate or package substrate of a top package of a package-on-package device. A first mold layer, for example of a bottom package of the package-on-package device, may be provided to have a guide hole defined in a top surface thereof. During a reflow process of solder balls, the first protruding portion of the first substrate may be provided in the guide hole of the first mold layer. Accordingly, it may be possible to prevent the first substrate from being undesirably shifted. Furthermore, upper solder balls may be satisfactorily connected to lower solder balls. Thus, it may be possible to improve reliability of a semiconductor package.

As discussed above and in the claims, different substrates may be referred to as "first," "second," or "third" substrates as a naming convention, to broadly refer to any three of the substrates discussed in the various embodiments. These and other items may be described in the claims as "first," "second," etc., simply as a naming convention, without necessarily corresponding to items using those naming conventions in the specification.

In a process of fabricating a semiconductor package, it may be possible to use a warpage-prevention unit for suppressing or preventing warpage of the interposer substrate. This may make it possible to increase production yield of a semiconductor package.

The protrusions, or alignment protrusions, described herein may also be described as alignment posts or guide posts, and the guide portions described herein may be referred to as alignment holes or receptacles, or as guide holes or receptacles.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a first semiconductor chip on a first substrate;
a first mold layer provided on the first substrate to cover a side surface of the first semiconductor chip;

a solder structure provided on the first substrate; and
a second substrate provided on the solder structure, wherein:
a guide receptacle is formed at one of a top surface of the first mold layer and a bottom surface of the second substrate,
a first alignment protrusion is formed at the other of the top surface of the first mold layer and the bottom surface of the second substrate and consists of an electrically insulating material composition, and
at least a portion of the first alignment protrusion is provided in the guide receptacle.

2. The semiconductor package of claim 1, wherein:
the guide receptacle is formed in the top surface of the first mold layer; and
the second substrate is an interposer substrate and the first alignment protrusion is formed on a bottom surface of the interposer substrate.

3. The semiconductor package of claim 1, wherein the second substrate is formed of an insulating material, and the first alignment protrusion comprises the same insulating material as the second substrate.

4. The semiconductor package of claim 1, wherein the first alignment protrusion is spaced apart from the first semiconductor chip, when viewed in a plan view.

5. The semiconductor package of claim 2, further comprising:
a third substrate provided on the interposer substrate;
a second semiconductor chip mounted on the third substrate; and
a second mold layer provided on the third substrate to cover the second semiconductor chip.

6. The semiconductor package of claim 2, wherein a bottom surface of the first alignment protrusion is located at a level lower than an uppermost surface of the first mold layer, and
the bottom surface of the first alignment protrusion is located at a level equal to or higher than a bottom surface of the guide receptacle.

7. The semiconductor package of claim 2, wherein the interposer substrate further comprises a second protrusion provided on the bottom surface thereof,
the second protrusion is provided on a top surface of the first semiconductor chip, and
a bottom surface of the first alignment protrusion is located at a level lower than a bottom surface of the second protrusion.

8. The semiconductor package of claim 2, wherein the first mold layer is provided to have a trench formed in the top surface thereof and to include a first guide portion defined by the trench, and
the guide receptacle is formed in the first guide portion.

9. The semiconductor package of claim 8, wherein a bottom surface of the trench is located at the same level as a bottom surface of the guide receptacle.

10. A semiconductor package, comprising:
a first substrate;
a first semiconductor chip on the first substrate;
a first mold layer provided on the first substrate to cover a side surface of the first semiconductor chip, the first mold layer comprising a first guide portion formed in a top surface thereof;
solder structures provided on the first substrate; and
an interposer substrate provided on the solder structures and spaced apart from the first semiconductor chip,
wherein the interposer substrate comprises a first insulating protruding portion provided on a bottom surface thereof, and
at least a portion of a side surface of the first insulating protruding portion faces a side surface of the first guide portion,
wherein the first guide portion is defined by a trench, and the first mold layer further comprises a second guide portion defined by the trench, and
wherein the second guide portion is provided between an outer side surface of the first substrate and an outermost one of the solder structures, when viewed in a plan view.

11. The semiconductor package of claim 10, wherein a bottom surface of the first insulating protruding portion is located at a level lower than a top surface of the first guide portion.

12. The semiconductor package of claim 10, wherein the first insulating protruding portion is spaced apart from the solder structures and the first semiconductor chip.

13. The semiconductor package of claim 10, further comprising an under-fill layer interposed between the side surface of the first insulating protruding portion and the side surface of the first guide portion.

14. The semiconductor package of claim 10, wherein the interposer substrate further comprises a second insulating protruding portion provided on the bottom surface thereof,
the second insulating protruding portion overlaps the first semiconductor chip, when viewed in a plan view, and
the first insulating protruding portion has a thickness in a vertical direction greater than that of the second insulating protruding portion.

15. The semiconductor package of claim 10, wherein the first guide portion comprises a plurality of sub-guide portions spaced apart from each other, and
the first insulating protruding portion is provided between the sub-guide portions.

16. The semiconductor package of claim 10, wherein the first insulating protruding portion comprises a plurality of sub-protruding portions spaced apart from each other, and
the first guide portion is provided between the sub-protruding portions.

17. A semiconductor package, comprising:
a first semiconductor chip on a first substrate;
a first mold layer covering a side surface of the first semiconductor chip, the first mold layer having a first top surface and a second top surface, which is located at a level lower than the first top surface;
a solder structure provided on the first substrate; and
a second substrate provided on the solder structure,
wherein the second substrate comprises a first insulating protruding portion provided on a bottom surface thereof,
a bottom surface of the first insulating protruding portion is located at a level, which is lower than the first top surface of the first mold layer and is equal to or higher than the second top surface of the first mold layer, and
the first insulating protruding portion is spaced apart from the solder structure and the first semiconductor chip when viewed in a plan view, and wherein:
the second substrate further comprises a second insulating protruding portion provided on the bottom surface thereof,
the second insulating protruding portion overlaps the first semiconductor chip, when viewed in a plan view, and the first insulating protruding portion has a thickness in a vertical direction greater than that of the second insulating protruding portion.

18. The semiconductor package of claim 17, wherein the second substrate comprises an interposer substrate.

19. The semiconductor package of claim 17, wherein the insulating protruding portion comprises a solder resist material.

\* \* \* \* \*